(12) United States Patent
Tagawa et al.

(10) Patent No.: US 10,964,244 B2
(45) Date of Patent: Mar. 30, 2021

(54) DISPLAY DEVICE

(71) Applicant: Sharp Kabushiki Kaisha, Sakai (JP)

(72) Inventors: Akira Tagawa, Sakai (JP); Yasuaki Iwase, Sakai (JP); Jun Nishimura, Sakai (JP); Takuya Watanabe, Sakai (JP); Yohei Takeuchi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/551,768

(22) Filed: Aug. 27, 2019

(65) Prior Publication Data
US 2020/0074907 A1 Mar. 5, 2020

Related U.S. Application Data (60) Provisional application No. 62/726,448, filed on Sep. 4, 2018.

(51) Int. Cl.
*G09G 3/20* (2006.01)

(52) U.S. Cl.
CPC ....... *G09G 3/20* (2013.01); *G09G 2310/0286* (2013.01); *G09G 2310/08* (2013.01); *G09G 2320/0252* (2013.01)

(58) Field of Classification Search
CPC .................................................. G11C 19/28
See application file for complete search history.

(56) References Cited

U.S. PATENT DOCUMENTS

| | | | | |
|---|---|---|---|---|
| 6,362,643 B1* | 3/2002 | Kim | ....................... | G09G 3/006 324/760.02 |
| 2004/0246246 A1* | 12/2004 | Tobita | ..................... | G09G 3/20 345/205 |
| 2006/0284815 A1* | 12/2006 | Kwon | .................. | G09G 3/3614 345/98 |
| 2007/0070021 A1* | 3/2007 | Ahin | .................. | H03K 5/15093 345/100 |
| 2009/0033641 A1* | 2/2009 | Yamazaki | ............ | G09G 3/3674 345/204 |
| 2011/0267326 A1* | 11/2011 | Kim | ..................... | G09G 3/3677 345/211 |

(Continued)

FOREIGN PATENT DOCUMENTS

| | | |
|---|---|---|
| JP | 2013-190719 A | 9/2013 |
| JP | 2014-182203 A | 9/2014 |

(Continued)

*Primary Examiner* — Nitin Patel
*Assistant Examiner* — Amen W. Bogale
(74) *Attorney, Agent, or Firm* — Keating & Bennett, LLP (57) ABSTRACT

[Object] An object is to suppress an occurrence of display unevenness in a pause-and-drive operation.
[Solution] A display device configured to perform pause-and-drive operation includes an nth stage circuit connected to one end of an nth gate bus line, and an nth transistor connected to the other end of the nth gate bus line. One of a first clock signal group (AGCK1 to AGCK6) is input to the nth stage circuit. One of a second clock signal group (BGCK1 to BGCK6) is input to the nth transistor. In a pause period in which all clock signals of the first clock signal group are fixed at an inactive level, one or more pulses (P3 to P6) are included in the second signal group.

14 Claims, 11 Drawing Sheets

(56) References Cited

U.S. PATENT DOCUMENTS

| | | | |
|---|---|---|---|
| 2013/0021317 A1* | 1/2013 | Liao | G09G 3/3677 345/212 |
| 2013/0241814 A1 | 9/2013 | Hirabayashi et al. | |
| 2013/0300681 A1* | 11/2013 | Jamshidi-Roudbari | G06F 3/044 345/173 |
| 2014/0267156 A1 | 9/2014 | Koga et al. | |
| 2015/0029081 A1* | 1/2015 | Kawachi | G09G 3/3677 345/92 |
| 2015/0194121 A1* | 7/2015 | Lee | G09G 3/3677 345/212 |
| 2015/0268777 A1 | 9/2015 | Okamura | |
| 2016/0267866 A1* | 9/2016 | Ooishi | G09G 3/3648 |
| 2016/0267869 A1* | 9/2016 | Kawachi | G09G 3/3677 |
| 2017/0047033 A1* | 2/2017 | Tanaka | G02F 1/1368 |
| 2017/0316730 A1* | 11/2017 | Cheng | H01L 27/124 |
| 2018/0246607 A1* | 8/2018 | Pai | G06F 3/04166 |

FOREIGN PATENT DOCUMENTS

| | | |
|---|---|---|
| JP | 5758825 B2 | 8/2015 |
| JP | 2015-184313 A | 10/2015 |

\* cited by examiner

REFERENCE CONFIGURATION

DISPLAY DEVICE

TECHNICAL FIELD

The present invention relates to a display device.

BACKGROUND ART

PTL 1 discloses a method of performing a pause-and-drive operation for touch sensing in a liquid crystal panel.

CITATION LIST

Patent Literature

[PTL 1] U.S. Pat. No. 5,758,825 (published on Sep. 26, 2013)

SUMMARY OF INVENTION

Technical Problem

In a case where a shift operation of a shift register is paused in the middle of the operation, there is a problem that a display unevenness may occur between a pause row and other rows.

Solution to Problem (1) In one embodiment, the present invention provides a display device including a display area and a driver circuit and configured to pause scanning in a middle of an operation of scanning a plurality of gate bus lines of the display area and restart the scanning after a pause period, wherein the driver circuit includes an nth stage circuit connected to one end of an nth gate bus line and configured to output a pulse signal to the nth gate bus line and an nth transistor whose one conduction terminal is connected to a constant voltage source and whose other conduction terminal is connected to the other end of the nth gate bus line, and wherein one clock signal of a first clock signal group is input to the nth stage circuit, and one clock signal of a second clock signal group is input to the gate terminal of the nth transistor, and one or more pulses are included in the second clock signal group in the pause period in which all clock signals of the first clock signal group are fixed at an inactive level.

(2) In the display device according to an embodiment of the present invention, based on (1), the clock signal input to the nth stage circuit and the clock signal input to the gate terminal of the nth transistor are opposite in phase.

(3) In the display device according to an embodiment of the present invention, based on (1), the plurality of clock signals of the first clock signal group are sequentially turned inactive and fixed before the pause period, and the pause period starts at a time when all clock signals become inactive.

(4) In the display device according to an embodiment of the present invention, based on (1), the driver circuit includes an mth stage circuit which is connected to one end of an mth gate bus line scanned prior to the nth gate but line and which outputs a pulse signal to the mth gate bus line, and an mth transistor whose one conduction terminal is connected to a constant voltage source and whose other conduction terminal is connected to the other end of the mth gate bus line, and the mth stage circuit is a unit stage of a first shift register formed on one side of the display area, and the nth stage circuit is a unit stage of a first shift register formed on the other side of the display area.

(5) In the display device according to an embodiment of the present invention, based on (1), an amplitude of each clock signal of the second clock signal group and an amplitude of each clock signal of the first clock signal group are different.

(6) In the display device according to an embodiment of the present invention, based on (1), a pulse width of each clock signal of the second clock signal group and a pulse width of each clock signal of the first clock signal group are different.

(7) In the display device according to an embodiment of the present invention, based on (1), the driver circuit includes a semiconductor layer formed of an oxide semiconductor.

(8) In the display device according to an embodiment of the present invention, based on (1), the display area and the driver circuit are formed on the same substrate.

Advantage Effects of Invention

According to one aspect of the present invention, it is possible to suppress an occurrence of display unevenness in a liquid crystal panel.

DESCRIPTION OF EMBODIMENTS

In the present embodiment, in a display device (for example, a liquid crystal display) including a comb type monolithic driver circuit (a gate driver circuit), two sets of clock signal groups to be supplied to the driver circuit are prepared. A first set of clock signals is supplied to a shift register connected to one end of a gate bus line (scanning signal line) such that outputting of clock signals is sequentially stopped (fixed to a Low potential) in response to a pause period. A second set of clock signals is supplied to a transistor connected to the other end of the gate bus line such that at least one pulse is output after the clock output of the first clock signal set is stopped (the pause period starts).

The second clock signal set makes it possible to realize sharpening of falling of a pulse signal (scanning signal) on the gate bus line, which results in a reduction in display unevenness caused by the difference in the pulse falling time between a pause row and other rows.

The display device according to the present embodiment is applicable not only to liquid crystal displays, but also to OLED (organic light emitting diode) displays or QLED (quantum dot light emitting diode) displays.

Embodiment 1

Figure 1A:
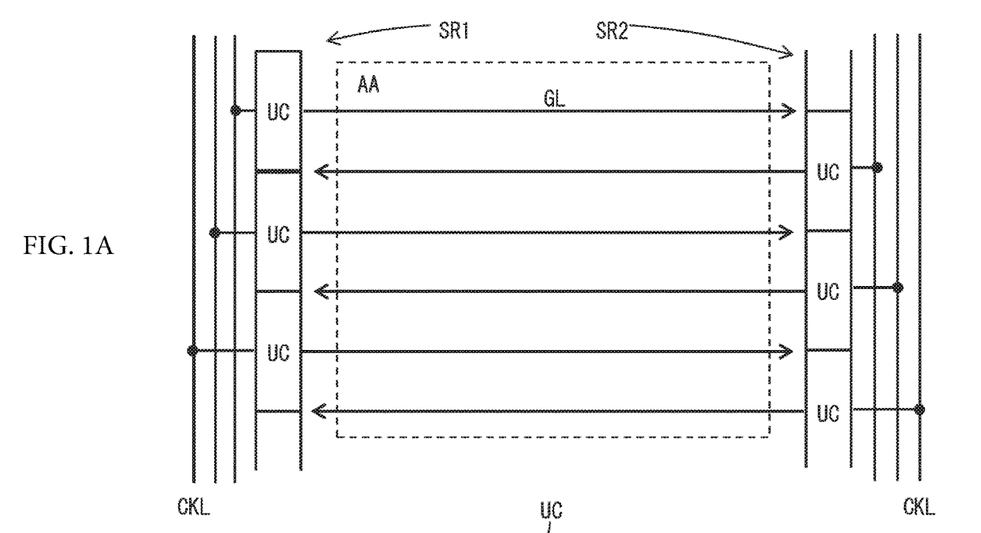
FIG. 1A is a schematic diagram showing a configuration of a display device according to Embodiment 1.
Figure 1B:
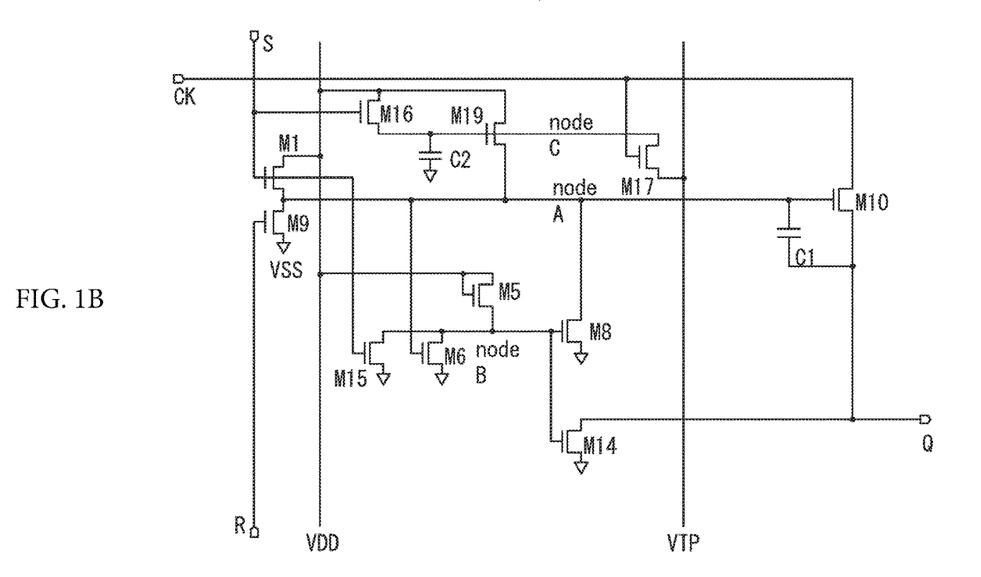
FIG. 1B is a circuit diagram showing a configuration of a unit stage according to Embodiment 1.

FIG. 1A is a schematic diagram showing a configuration of a display device according to Embodiment 1, and FIG. 1B is a circuit diagram showing a configuration of a unit stage.

In the display device according to Embodiment 1, shift registers SR1 and SR2 are monolithically formed in a frame area surrounding a display area AA. In the display area AA, a plurality of sub-pixels, a plurality of scanning signal lines (gate bus lines) GL, and a plurality of data signal lines are provided. Each sub-pixel includes a transistor and a pixel electrode, and the pixel electrode is connected to a scanning signal line GL and a data signal line via the transistor.

Each odd-numbered scanning signal line GL is connected to a stage circuit (unit circuit) UC of the shift register SR1 located on one side of the display area AA, and each even-numbered scanning signal line GL is connected to a stage circuit (unit circuit) UC of the shift register SR2 located on one side of the display area AA, is located on the other side of the display area AA (in a so-called comb-tooth form). The stage circuit UC is connected to one of six clock signal lines CKL corresponding to a first clock signal group (six phases).

As shown in FIG. 1B, the stage circuit UC includes a clock terminal CK, a set terminal S, a reset terminal R, and an output terminal Q. The set terminal S is connected to a gate terminal of a transistor M1. A node A is connected to a VDD line (a high voltage power supply) via the transistor M1. The clock terminal CK is connected to the output terminal Q via a transistor M10. A gate terminal of the transistor M10 is connected to the node A and is also connected to the output terminal Q via a capacitor C1. The reset terminal R is connected to a gate terminal of a transistor M9, and the node A is connected to a VSS line (a low voltage power supply) via the transistor M9. A clock terminal CK is connected to one of six clock signal lines CKL corresponding to the first clock signal group (six phases). The set terminal S is connected to an output terminal of a stage preceding to the present stage of interest. The output terminal Q is connected to the scanning signal line GL of the present stage of interest, and the reset terminal R is connected to an output terminal of a stage following the present stage of interest.

Figure 2:
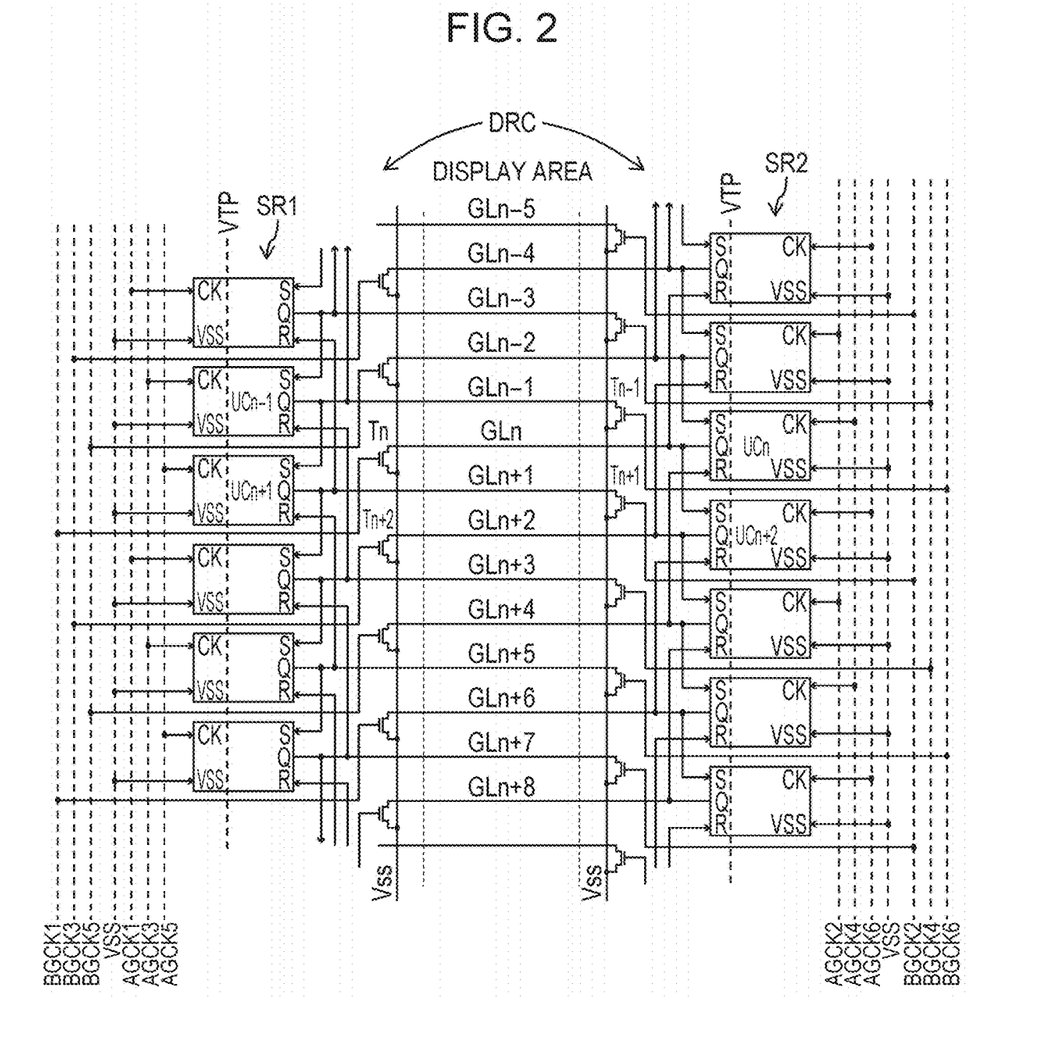
FIG. 2 is a schematic diagram showing a configuration of a driver circuit according to Embodiment 1.
Figure 3:
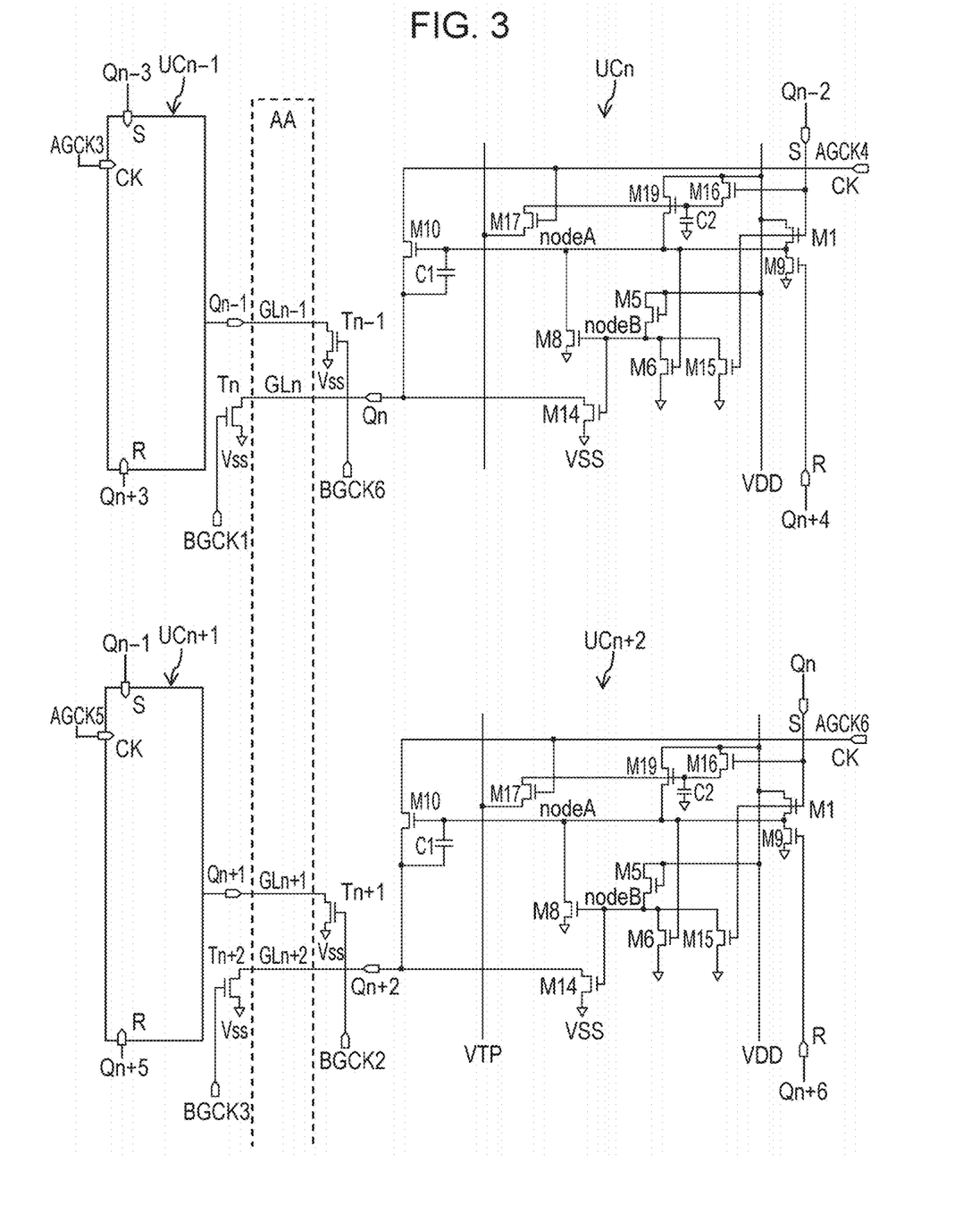
FIG. 3 is a circuit diagram showing a part of a driver circuit.

FIG. 2 is a schematic diagram illustrating a configuration of the driver circuit. FIG. 3 shows a circuit of a part of the driver circuit. A driver circuit DRC includes shift registers SR1 and SR2 and (n−1)th transistor Tn−1 to (n+2)th transistor Tn+2, and the driver circuit DRC is monolithically formed with the display area AA (including pixel electrodes, scanning signal lines, data signal lines, and transistors connected to the pixel electrodes). The shift register SR1 includes an (n−1)th stage circuit UCn−1 and an (n+1)th stage circuit UCn+1, while the shift register SR2 includes an nth stage circuit UCn and an (n+2)th stage circuit UCn+2.

For example, the nth stage circuit UCn is connected to one end of the scanning signal line GLn (an nth scanning signal line) and outputs a pulse signal to a scanning signal line GLn. One conduction terminal of the nth transistor Tn is connected to the VSS line (the low voltage power supply which is a constant voltage source), and the other conduction terminal is connected to the other end of the scanning signal line GLn. A clock signal AGCK4, which is one of the first clock signal groups (AGCK1 to AGCK6), is input to the nth stage circuit UCn. A clock signal BGCK1, which is one of the second clock signal groups (BGCK1 to BGCK6), is input to a gate terminal of the nth transistor Tn. The clock signal AGCK4 and the clock signal BGCK1 are opposite in phase.

Figure 4:
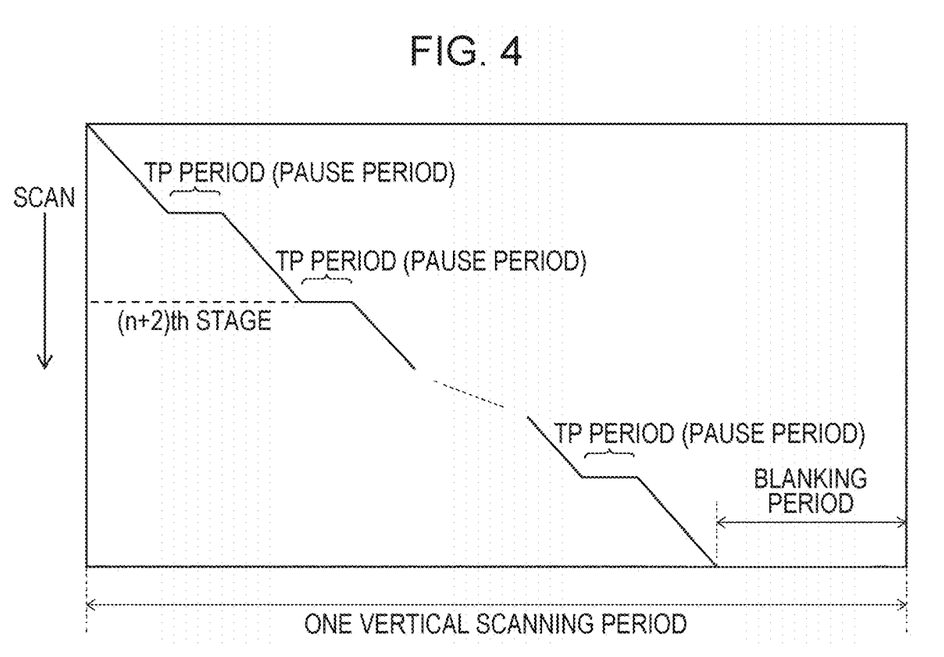
FIG. 4 is a schematic diagram showing a pause-and-drive operation of a display device.
Figure 5:
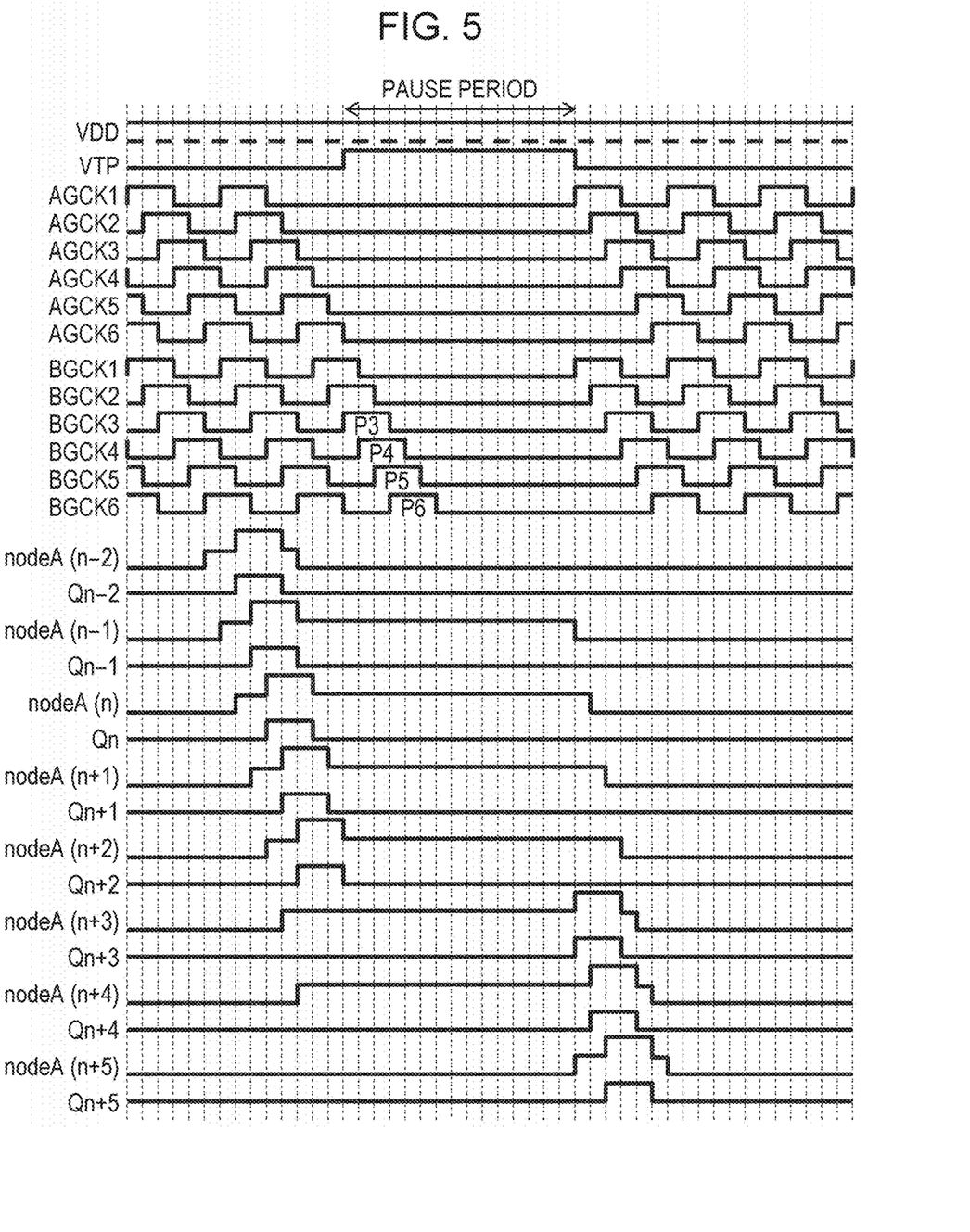
FIG. 5 is a timing chart showing an operation of a driver circuit according to Embodiment 1.

FIG. 4 is a schematic diagram illustrating the pause-and-drive operation of the driver circuit, and FIG. 5 is a timing chart illustrating an operation of the driver. As shown in FIG. 4, for example, in a case where the (n+2)th stage is a pause stage (the scanning signal line GLn+2 is in a pause row), the driver circuit DRC operates as shown in FIG. 5.

In the clock signals AGCK1 to AGCK6 of the first clock signal group, a phase shift of 60° occurs from one to next in this order, and in the clock signals BGCK1 to BGCK6 of the second clock signal group, a phase shift of 60° occurs from one to next in this order. The clock signal AGCK1 and the clock signal BGCK1 have the same phase. The pulse width of a pulse signal at each output terminal is equal to the pulse width of each clock signal.

The clock signals AGCK1 to AGCK6 are sequentially turned inactive and fixed before a pause period. When all clock signals become inactive (the last AGCK6 becomes inactive, and the pulse signal at the output terminal Qn+2 of the pause stage returns to Low), the pause period starts.

The node A(n) of the nth stage circuit UCn becomes High (activated) in response to rising of the pulse signal at the output terminal Qn−2 of a two stages before the current stage, and becomes further higher than High due to a bootstrap effect of the capacitor C1. In this state, AGCK4 is output to the output terminal Qn via the transistor M10, and thus the pulse signal at the output terminal Qn connected to one end of the scanning signal line GLn rises (to High) in response to the rising of the clock signal AGCK4. Thereafter, when the clock signal AGCK4 becomes Low, the pulse signal at the output terminal Qn also returns (falls down) to Low.

In synchronization with the clock signal AGCK4 becoming Low, the clock signal BGCK1 (in reverse phase to AGCK4) becomes High and the transistor Tn is turned on. As a result, the other end of the scanning signal line GLn is connected to a VSS line (a low voltage power supply), and the pulse signal propagating along the scanning signal line GLn (in particular, at the other end) steeply falls down (quickly returns to Low).

When the (n+2)th stage is a pause stage, the pulse signal (reset signal) at the output terminal Qn+4 does not rise until the restart, and thus the node A(n) remains in the High state (set state). Since the clock signal AGCK4 is fixed at Low preceding to a pause period, the output terminal Qn remains in the Low state.

The node A(n+2) of the (n+2)th stage circuit UCn+2 in a pause state becomes High (the transistor M10 is turned on) in response to rising (activation) of the pulse signal at the output terminal Qn, and further becomes higher than High due to a bootstrap effect of the capacitor C1. In this state, the clock signal AGCK6 is output to the output terminal Qn+2 via the transistor M10, and thus the pulse signal at the output terminal Qn+2 connected to one end of the scanning signal line GLn+2 rises (becomes High) in response to the rising of the clock signal AGCK6. After that, when the clock signal AGCK6 becomes Low, the pulse signal at the output terminal Qn+2 also returns (falls down) to Low, and a pause period starts.

In synchronization with the change of the clock signal AGCK6 to Low, the clock signal BGCK3 becomes High and the transistor Tn+2 turns on. As a result, the other end of the scanning signal line GLn+2 is connected to the VSS line (the low voltage power supply), and the pulse signal propagating along the scanning signal line GLn+2 (in particular, at the other end) steeply falls down (quickly returns to Low).

When the pause period ends, the clock signal AGCK1 returns from Low to High. As a result, the pulse signal at the output terminal Qn+3 rises (is activated), and scanning is restarted.

As described above, a pulse P3 is included in the pulse signal BGCK3 of the second clock signal group (BGCK1 to BGCK6) in the pause period in which all clock signals of the first clock signal group (AGCK1 to AGCK6) are fixed at the inactive level, and thus even at the scanning signal line GLn+2 (in particular, at the other end) which is a pause row, the pulse signal (scanning signal) falls down sharply, and display unevenness is suppressed.

As described above, according to Embodiment 1, it is possible to achieve sharp falling down for the pulse signal (the scanning signal) transmitted along the scanning signal line while achieving a reduction in the circuit area by employing the comb-teeth form in the driver circuit, thereby achieving an effect that display unevenness hardly occurs even when pause driving is performed.

Figure 6:
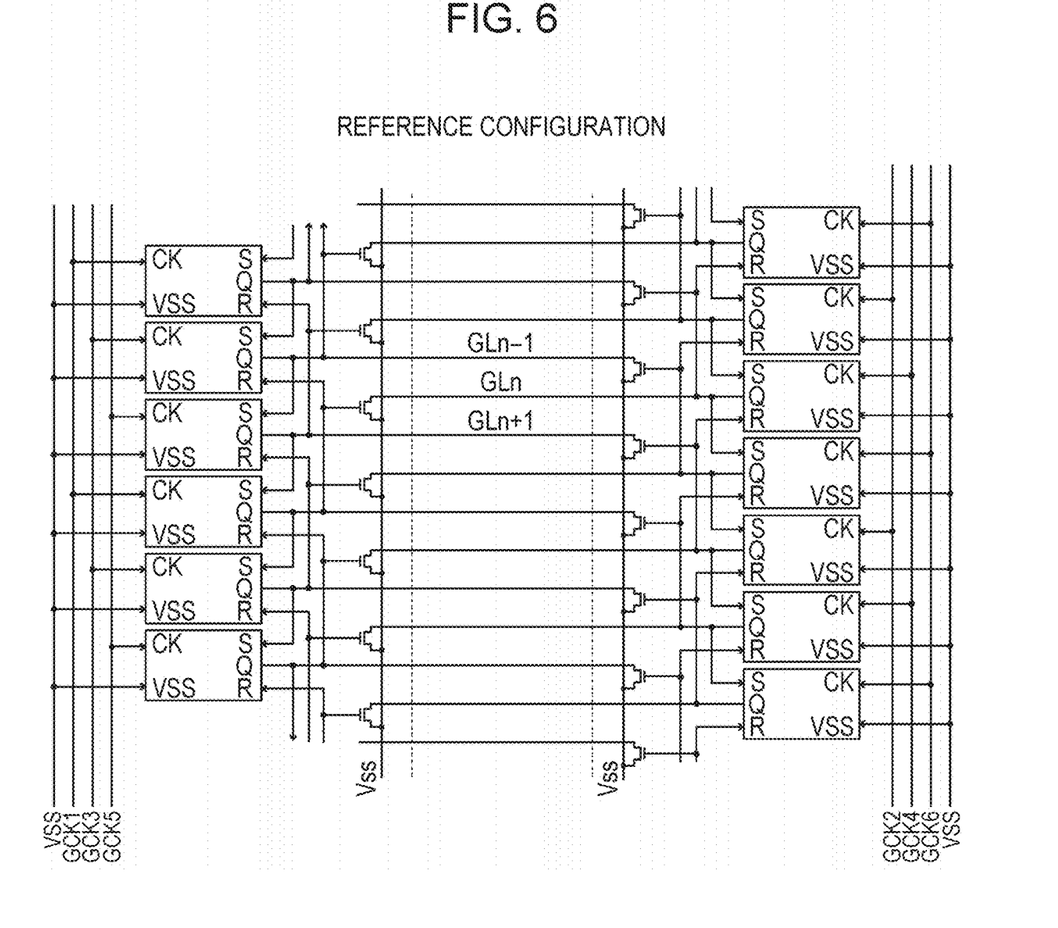
FIG. 6 is a schematic diagram showing a reference configuration of a driver circuit.

FIG. 6 is a circuit diagram showing a reference configuration of the driver circuit. The driver circuit shown in FIG. 6 is configured such that in response to rising of a pulse signal at a following stage, the other end of the scanning signal line GLn+2 of the present stage of interest is connected to the VSS line (the low voltage power supply). In this reference configuration, the pulse signal of the subsequent stage does not rise at a time when the pulse signal of the pause stage falls (the scanning signal line of the pause row is not connected to the low voltage power supply), and thus in the pause row, falling of the pulse signal (the scanning signal) transmitted along the scanning signal line becomes dull, which may cause display unevenness to occur.

Each stage circuit shown in FIGS. 1 to 3 includes a transistor M15 whose gate terminal is connected to the set terminal S, a transistor M6 whose gate terminal is connected to the node A, a transistor M5 whose gate terminal and one conduction terminal are connected to the VDD line, and transistors M8 and M14 whose gate terminals are connected to the node B. The node A is connected to the VSS line via the transistor M8, the output terminal Q is connected to the VSS line via the transistor M14, and the node B is connected to the VDD line via the transistor M5 and also connected to the VSS line via the transistors M6 and M15.

During periods in which the node A is not High, the node B goes High (the transistor M14 connected to the VSS line turns on), and the output terminal Qn is maintained at Low regardless of the influence of noise, coupling, and/or the like. Similarly, during periods in which the node A is not High, the transistor M8 turns on, and the node A is maintained at Low, and thus an erroneous operation due to noise, coupling, or the like is avoided.

Each stage circuit shown in FIGS. 1 to 3 includes a transistor M16 whose gate terminal is connected to the set terminal S, a transistor M17 whose gate terminal is connected to the clock terminal CK, and a transistor M19 whose gate terminal is connected to the node C. The node A is connected to the VDD line via the transistor M19, the node C is connected to a VTP (touch panel signal) line via the transistor M17, the node C is connected to the VDD line via the transistor M16, and a capacitor C2 is formed between the node C and the VSS line.

The node C, the transistors M16, M17, and M19, and the capacitor C2 are used to maintain the node A, which will operate immediately after the pause period, at the High level during the pause period.

In the example shown in FIGS. 1 to 6 (in which the (n+2)th stage is in the pause state), after the end of the pause period, the pulse is raised to GLn+3 by the (n+3)th stage circuit UCn+3, which causes the scanning to restart. The node A(n+3) of the (n+3)th stage circuit UCn+3 becomes High due to the rising of the pulse signal of the output terminal Qn+1 of a stage two stages before the current stage. Thereafter, when CK of UCn+3 becomes High, the node A(n+3) becomes higher exceeding High due to the bootstrap effect of the capacitor C1. However, in this example, since the (n+2)th stage is in the pause state, the node A(n+3) is raised to High by Qn+1 before the pause period, but the further rising in the potential due to the bootstrap effect of the capacitor C1 occurs after the end of the pause period. That is, after the node A(n+3) becomes High due to Qn+1, it is necessary to keep this state over the whole following pause period.

The length of the pause period may exceed 500 μs depending on specifications of the panel and/or the touch function, and it is necessary that the potential of the node A(n+3) is kept high for such a long period of time. In this period, an off-state current may occur in the transistor connected to the node A(n+3), which may cause a charge of the node A(n+3) to be lost, and thus a reduction in the potential (voltage) may occur. If a large reduction in the voltage at the node A(n+3) occurs during the pause period, a sufficient bootstrap effect is not achieved after the pause period, and thus the pulse of Qn+3 becomes duller than the Q output (pulse) of other stages, which may cause display unevenness to occur and may cause the shift operation to stop. In this example, UCn+4 also operates in a similar manner.

As described above, the node C, the transistors M16, M17, and M19, and the capacitor C2 are used to prevent dropping of the voltage at the node A in the pause period. As with the node A, the node C becomes High in response to rising of the pulse signal applied to the set terminal S. The node C is connected to the VTP line immediately after CK becomes High (at the same timing as Q is output from the present stage of interest). As shown in FIG. 5, since the VTP line is Low during periods other than the pause period, the node C is reset to Low at the same timing as Q is output from the present stage of interest. That is, the node C remains High over the period from a time of rising of the pulse signal applied to the set terminal S to a time of outputting Q from the present stage of interest. In UCn+3 described above, the node C(n+3) becomes High before the pause period and the High level is maintained by the capacitor C2 during the pause period. When Qn+3 is output after the pause period, node C(n+3) is simultaneously reset to Low.

Since the node C(n+3) is High over the pause period, even if a drop of the voltage at node A (n+3) occurs, node A(n+3) is charged by VDD via M19, and thus the voltage drop at the node A(n+3) in the pause period can be suppressed.

In the pause period, there is a possibility that an off-current of the transistor M17 may change the potential of the node C(n+3) itself. To handle this situation, M17 is connected to the VTP line during the pause period. As shown in FIG. 5, the VTP line is controlled to be Low during any period other than the pause period and to be high only during the rest period. Thus, in the pause period, the source of M17 becomes High, and the potential drop at the node C(n+3) due to the off-current of M17 is suppressed. Note that UCn+4 also operates in a similar manner to UCn+3.

The amplitude of each clock signal of the second clock signal group (BGCK1 to BGCK6) may be larger than the amplitude of each clock signal of the first clock signal group (AGCK1 to AGCK6). This results, for example, in an increase in an on-current of the transistor Tn, and thus the size of the transistor Tn can be reduced, which is effective for narrowing the frame.

Note that the amplitude of each clock signal of the second clock signal group (BGCK1 to BGCK6) may be smaller than the amplitude of each clock signal of the first clock signal group (AGCK1 to AGCK6). This causes a reduction in the voltage applied to the gate terminal of, for example, the transistor Tn, and thus deterioration of the transistor Tn is prevented, and the long-term reliability of the display device is improved.

Note that the pulse width of each clock signal of the second clock signal group (BGCK1 to BGCK6) may be smaller than the pulse width of each clock signal of the first clock signal group (AGCK1 to AGCK6). In this case, the pulse width of the voltage applied to the gate terminal of the transistor Tn is reduced, and thus deterioration of the transistor Tn is prevented, and the long-term reliability of the display device is improved.

Furthermore, the duty ratio of each clock signal of the second clock signal group (BGCK1 to BGCK6) may be different from the duty ratio of each clock signal of the first clock signal group (AGCK1 to AGCK6).

The driver circuit DRC may include a semiconductor layer formed of an oxide semiconductor and a channel of each transistor in the driver circuit may formed using the oxide semiconductor.

Figure 7:
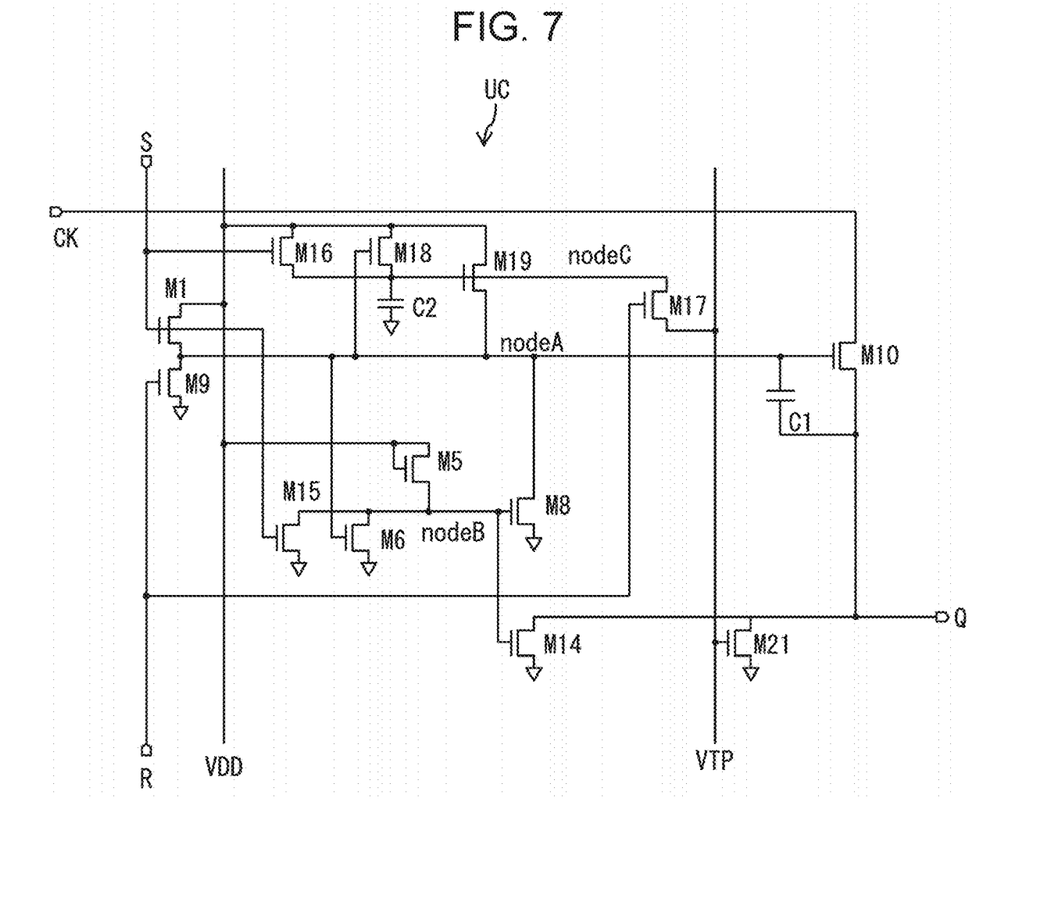
FIG. 7 is a circuit diagram showing another example of a unit stage of a driver circuit.

FIG. 7 is a circuit diagram showing another example of a unit stage of the driver circuit. The configuration shown in FIG. 7 is different from the configuration of the stage circuit shown in FIGS. 1 to 3 in that the gate terminal of the transistor M17 is connected to the reset terminal R, and a transistor M21 is added such that the gate terminal thereof is connected to the VTP line and the output terminal Q is connected to the VSS line via the transistor M21. This makes it possible to maintain the pulse signal at the output terminal Q at the Low level over the pause period in which the VTP line is High.

Embodiment 2

Figure 8:
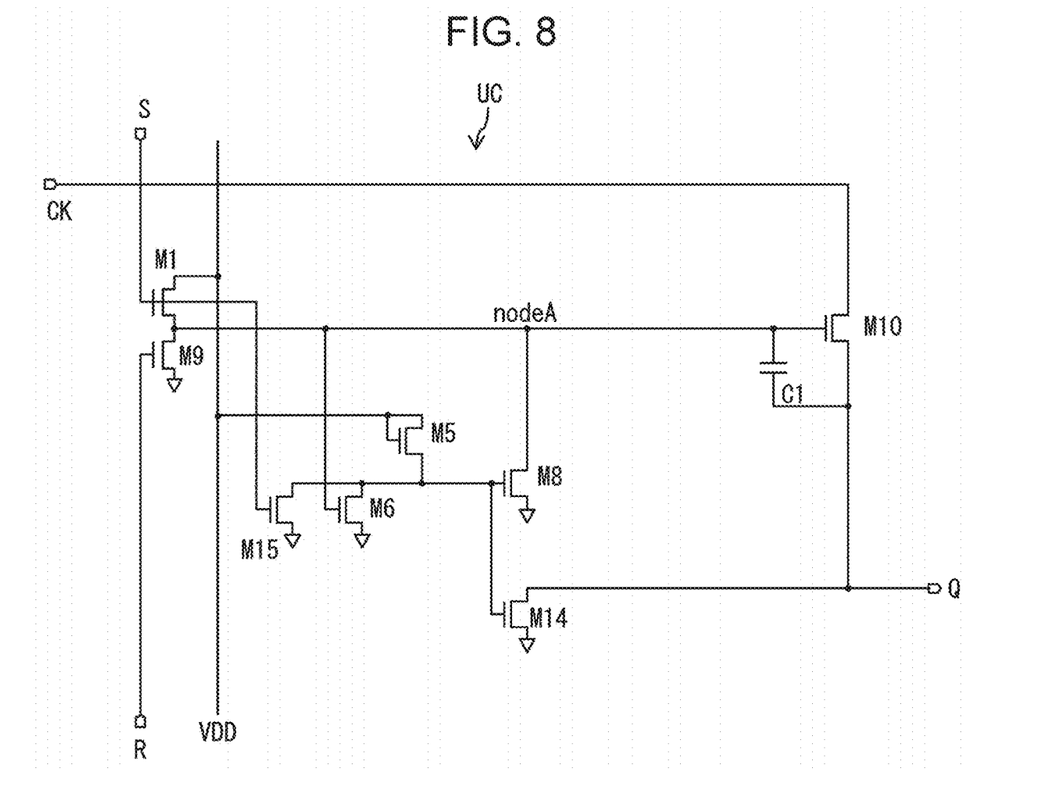
FIG. 8 is a circuit diagram showing a unit stage of a driver circuit according to Embodiment 2.
Figure 9:
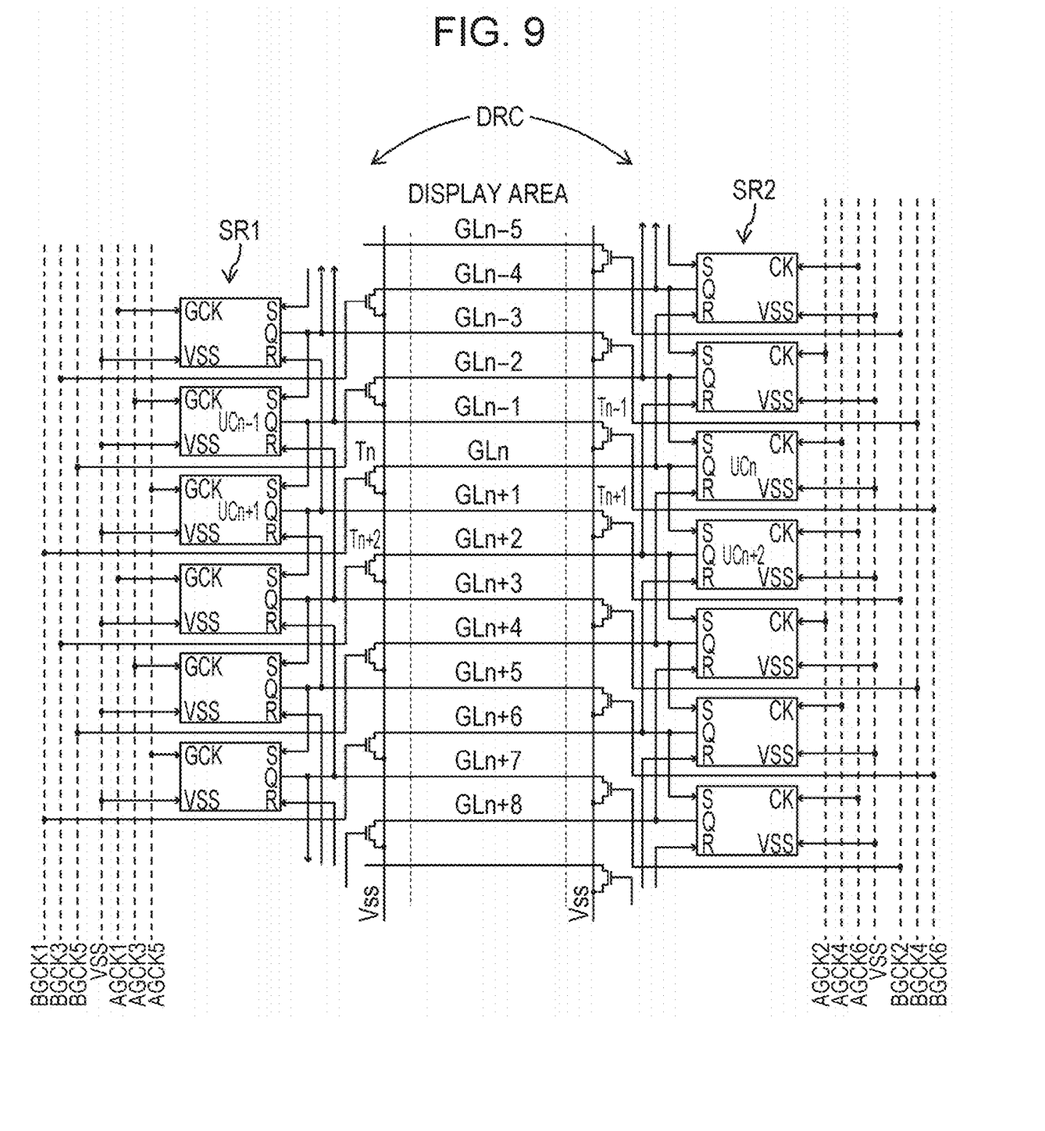
FIG. 9 is a schematic diagram showing a configuration of a driver circuit of according to Embodiment 2.
Figure 10:
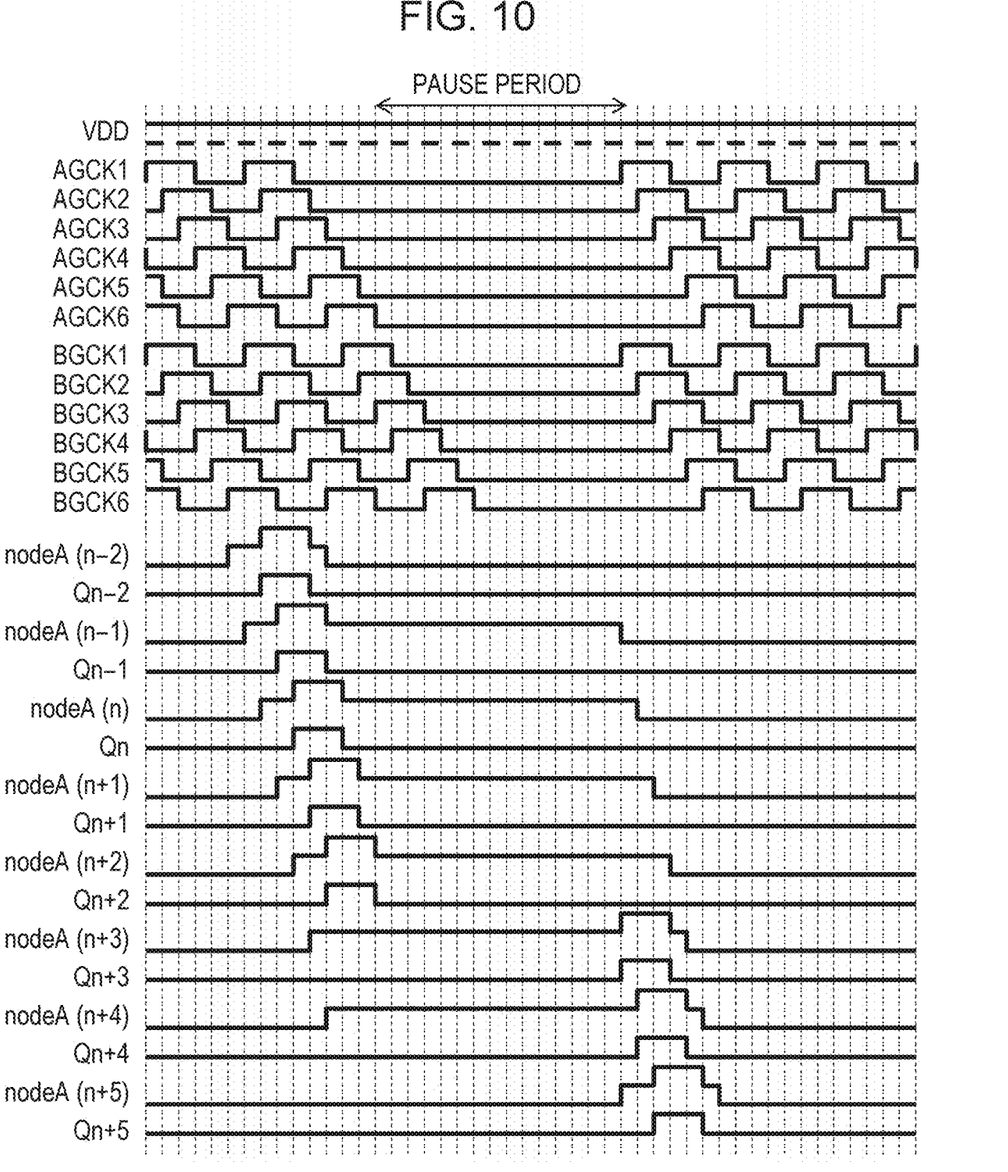
FIG. 10 is a timing chart showing an operation of a driver circuit according to Embodiment 2.

FIG. 8 is a circuit diagram showing a unit stage of a driver circuit according to Embodiment 2. FIG. 9 is a schematic diagram showing a configuration of the driver circuit according to Embodiment 2. FIG. 10 is a timing chart showing an operation of the driver circuit according to Embodiment 2. Another example of a circuit configuration of a unit stage of a driver circuit is shown.

In general, in transistors formed of an oxide semiconductor, the off-current is smaller than the off-current of an amorphous silicon transistor or a low temperature polysilicon transistor. Therefore, in a case where a driver circuit is formed using an oxide semiconductor transistor, depending on the length of the pause period, the node C, the transistors M16, M17, and M19, and the capacitor C2, which are used in Embodiment 1 for the purpose of maintaining the potential of the node A during the pause period, may not be necessary.

Figure 11:
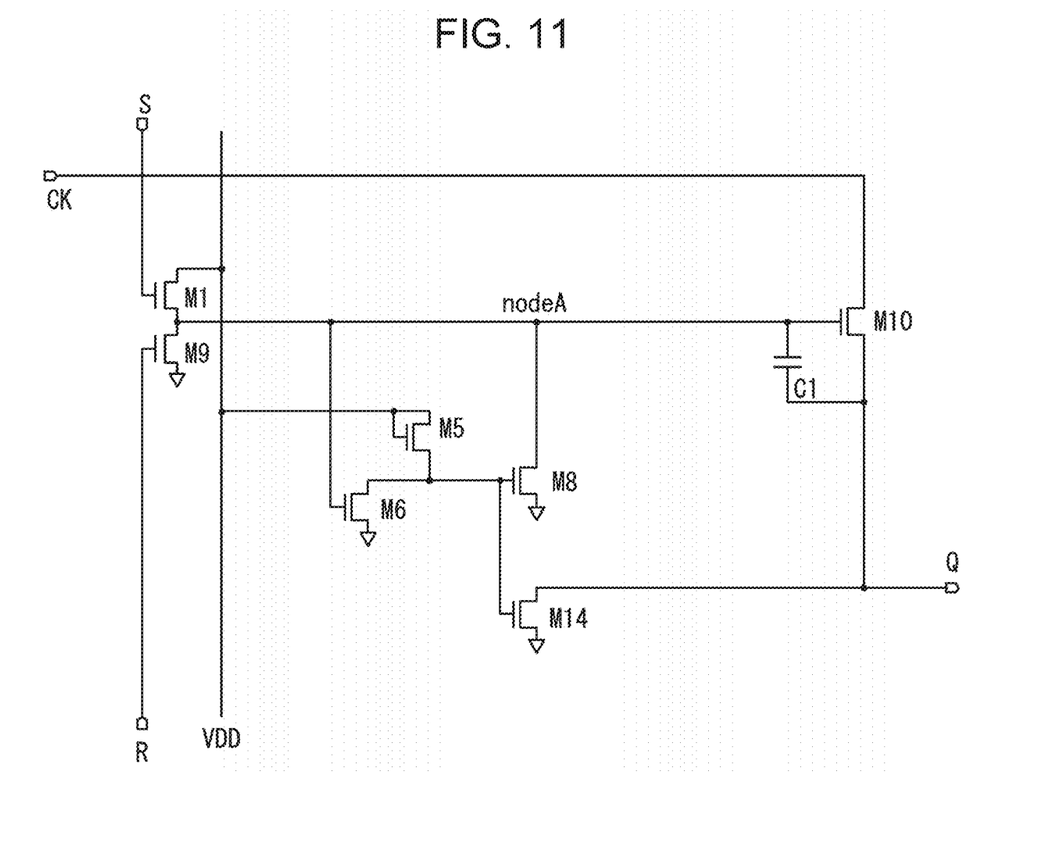
FIG. 11 is a circuit diagram showing another example of a unit stage of a driver circuit.

Thus, in Embodiment 2, unlike Embodiment 1, the transistors M16, M17, and M19, the node C, the capacitor C2, and the VTP line in each stage circuit are omitted. This results in a reduction in size of the stage circuit, which makes it possible to realize a narrower frame. Note that the transistor M15 may be omitted as shown in FIG. 11.

The present invention is not limited to the above-described embodiments, and various modifications can be made within the scope of the claims. Embodiments obtained by appropriately combining the technical means disclosed in the different embodiments also fall in the technical scope of the present invention. Furthermore, new technical features can be formed by combining the technical means disclosed in each embodiment.

REFERENCE SIGNS LIST

DRC driver circuit
SR1, SR2 shift register
UCn-1 (n-1)th stage circuit (mth stage circuit)
UCn nth stage circuit
AA display area
AGCK1 to AGCK6 first clock signal group
BGCK1 to BGCK6 second clock signal group
Tn nth transistor
VSS low voltage power supply line (constant voltage source)

The invention claimed is:

1. A display device comprising:
   a display area; and
   a driver circuit, wherein
   the display device is configured to pause scanning in a middle of an operation of scanning a plurality of gate bus lines of the display area and restart the scanning after a pause period,
   the driver circuit includes an nth stage circuit connected to one end of an nth gate bus line and configured to output a pulse signal to the nth gate bus line and an nth transistor whose one conduction terminal is connected to a constant voltage source and whose other conduction terminal is connected to the other end of the nth gate bus line,
   one clock signal of a first clock signal group is input to the nth stage circuit, and one clock signal of a second clock signal group is input to the gate terminal of the nth transistor, and
   one or more pulses are included in the second clock signal group, the one clock signal of which is input to the gate terminal of the nth transistor whose other conduction terminal is connected to the other end of the nth gate bus line that is fixed at an inactive level, in the pause period in which all clock signals of the first clock signal group are fixed at an inactive level so that the nth gate bus line, whose one end is connected to the nth stage circuit, is fixed at the inactive level.

2. The display device according to claim 1, wherein the clock signal input to the nth stage circuit and the clock signal input to the gate terminal of the nth transistor are opposite in phase.

3. The display device according to claim 1, wherein the plurality of clock signals of the first clock signal group are sequentially turned inactive and fixed before the pause period, and the pause period starts at a time when all clock signals become inactive.

4. The display device according to claim 1, wherein the driver circuit includes an mth stage circuit which is connected to one end of an mth gate bus line scanned prior to the nth gate but line and which outputs a pulse signal to the mth gate bus line, and an mth transistor whose one conduction terminal is connected to a constant voltage source and whose other conduction terminal is connected to the other end of the mth gate bus line, and wherein the mth stage circuit is a unit stage of a first shift register formed on one side of the display area, and the nth stage circuit is a unit stage of a first shift register formed on the other side of the display area.

5. The display device according to claim 1, wherein an amplitude of each clock signal of the second clock signal group and an amplitude of each clock signal of the first clock signal group are different.

6. The display device according to claim 1, wherein a pulse width of each clock signal of the second clock signal group and a pulse width of each clock signal of the first clock signal group are different.

7. The display device according to claim 1, wherein the driver circuit includes a semiconductor layer formed of an oxide semiconductor.

8. The display device according to claim 1, wherein the display area and the driver circuit are formed on the same substrate.

9. A display device comprising:
 a display area in which a plurality of gate bus lines are provided; and
 a driver circuit which scans the plurality of gate bus lines, wherein
 the driver circuit includes:
  unit circuits each of which is connected to a first end of a corresponding one of the plurality of gate bus lines and to each of which one clock signal of a first clock signal group is input, the each of the unit circuits being configured to output, to the corresponding one of the plurality of gate bus lines, a pulse signal which causes the corresponding one of the plurality of gate bus lines to be active, in a case where the one clock signal of the first clock signal group is input to the each of the unit circuits; and
  transistors each of which has a first conduction terminal which is connected to a constant voltage source, a second conduction terminal which is connected to a second end of a corresponding one of the plurality of gate bus lines, and a gate terminal to which one clock signal of a second clock signal group is input,
 the driver circuit has a pause period in which all clock signals of the first clock signal group are fixed at an inactive level so that the plurality of gate bus lines, each of which has the first end connected to a corresponding one of the unit circuits, are fixed at an inactive level and thereby scanning is paused in a middle of an operation of scanning the plurality of gate bus lines, and
 in the pause period, one or more pulses are included in the second clock signal group, the one clock signal of which is input to the gate terminal of the each of the transistors which has the second conduction terminal connected to the second end of the corresponding one of the plurality of gate bus lines that are fixed at the inactive level.

10. The display device according to claim 9, wherein the plurality of clock signals of the first clock signal group are sequentially turned inactive and fixed before the pause period, and the pause period starts at a time when all clock signals become inactive.

11. The display device according to claim 9, wherein an amplitude of each clock signal of the second clock signal group and an amplitude of each clock signal of the first clock signal group are different.

12. The display device according to claim 9, wherein a pulse width of each clock signal of the second clock signal group and a pulse width of each clock signal of the first clock signal group are different.

13. The display device according to claim 9, wherein the driver circuit includes a semiconductor layer formed of an oxide semiconductor.

14. The display device according to claim 9, wherein the display area and the driver circuit are formed on the same substrate.

* * * * *